United States Patent [19]

Jeon

[11] Patent Number: 5,930,191
[45] Date of Patent: Jul. 27, 1999

[54] SEMICONDUCTOR MEMORY DEVICE HAVING A PLURALITY OF POWER VOLTAGES

[75] Inventor: Jun-Young Jeon, Seoul, Rep. of Korea

[73] Assignee: Samsung Electronics, Co., Ltd., Suwon, Rep. of Korea

[21] Appl. No.: 08/986,908

[22] Filed: Dec. 8, 1997

[30] Foreign Application Priority Data

Dec. 6, 1996 [KR] Rep. of Korea ................ 96-62414

[51] Int. Cl.⁶ ............................................. G11C 7/00
[52] U.S. Cl. ............................................. 365/226; 257/371
[58] Field of Search ........................... 365/226; 257/369, 257/371, 903

[56] References Cited

U.S. PATENT DOCUMENTS

| | | | |
|---|---|---|---|
| 4,754,160 | 6/1988 | Ely | 307/64 |
| 5,285,093 | 2/1994 | Lage et al. | 257/332 |

Primary Examiner—David Nelms
Assistant Examiner—David Lam
Attorney, Agent, or Firm—Marger Johnson & McCollom, P.C.

[57] ABSTRACT

A semiconductor memory device operable under a first power voltage and a second power voltage which are different from each other. The memory device includes a substrate of a first conductivity type, a well of a second conductivity type defined in said substrate, and first and second inverter circuits defined serially with one another on the substrate and common well. The first inverter circuit includes a first transistor of a second conductivity type on the substrate and a first transistor of a first conductivity type on the well for receiving a first power voltage and generating a first inverted output voltage in response to a first input voltage applied to gates of the respective first transistors. The second inverter circuit includes a second transistor of a second conductivity type on the substrate and a second transistor of a first conductivity type on the well for receiving a second power voltage and generating a second inverted output voltage in response to a second input voltage applied to gates of the respective second transistors.

15 Claims, 2 Drawing Sheets

SEMICONDUCTOR MEMORY DEVICE HAVING A PLURALITY OF POWER VOLTAGES

BACKGROUND OF THE INVENTION

1. Field of the Invention

The present invention relates to semiconductor memory devices, and more particularly to a semiconductor memory device operating under a plurality of power voltages.

The present application is based on Korean Patent Application No. 96-62414 which is incorporated herein by reference for all purposes.

2. Description of the Related Art

Generally, as semiconductor memory device become more highly integrated, the thickness of the transistor gate oxide layers becomes thinner—e.g., 200 Å, 160 Å, 120 Å, etc.—in order to improve the performance of the transistor. However, if an external power voltage is applied directly to the thin gates of these semiconductor memory devices, the gate oxide layer may become damaged. Consequently, modern memory devices typically include an internal power voltage generating circuit which receives the external power voltage and generates a constant internal power voltage lower than the external power voltage. This internal power voltage is then applied to that portion of the semiconductor memory device as needed.

In order to apply both the external power voltage and lower internal power voltage to the memory device, respective wells of a first conductivity type (e.g. N-type) have traditionally been required for each voltage. The transistors of a second conductivity type (e.g. P-type), to which the external power voltage and internal power voltage are applied, are defined within these wells. In order to avoid the mutual interference between these transistors and wells, a region of an opposite conductivity type, such as a P-type well, is formed between the respective N-type wells to maintain a sufficient gap. Unfortunately, the advantage yielded by this design is offset by an equally important disadvantage. Though interference is reduced by the inclusion of this gap between the N-type wells, the total circuit area required for the memory chip is consequently increased.

FIG. 1 is a vertical cross-sectional view showing separated inverter circuits of the semiconductor memory device according to the prior art. As shown in FIG. 1, a first inverter 8 consists of a first P-channel transistor 3 formed within a first N-well 2 and a first N-channel transistor 7 formed within a P-well 5 or a P-type substrate 6 (referred to collectively herein as "substrate"). An external power voltage EVCC (i.e., a first power voltage) is applied to the source of the first P-channel transistor 3, and a substrate voltage Vsub is applied to the substrate.

A second inverter 13 consists of a second P-channel transistor 11 formed within a second N-well 10 and a second N-channel transistor 12 formed within the P-well 5 or the substrate 6. An internal power voltage IVCC (i.e., a second power voltage), lower than the external power voltage EVCC, is applied to the source of the second P-channel transistor 11. The substrate voltage Vsub is a ground voltage VSS or a negative voltage applied to the substrate.

An input voltage Vin(Ext) is supplied to gates 51 and 53 of the first N-channel transistor 7 and the first P-channel transistor 3, respectively. The first P-channel transistor 3 and the first N-channel transistor 7, when activated by the application of the input voltage Vin(Ext) to their gates, generate an output voltage Vout(Ext) through their common drains.

Likewise, an input voltage Vin(Int) is supplied to gates 55 and 57 of the second P-channel transistor 11 and the second N-channel transistor 12, respectively. The second P-channel transistor 11 and the second N-channel transistor 12, when activated by the application of the input voltage Vin(Int) to their gates, generate an output voltage Vout(Int) through their common drains.

In this case, the first power voltage EVCC is equal to or greater than the input voltage Vin(Ext), and the second power voltage IVCC is equal to or greater than the input voltage Vin(Int). The first and second inverters 8 and 13 are separated from each other by a constant gap to exclude mutual interference generated by the different power voltages, that is, the first and second power voltages applied respectively to the first and second N-wells 2 and 10. Consequently, the gap required between the inverter wells 2 and 10 creates an inefficiency in the layout of the memory circuit.

SUMMARY OF THE INVENTION

Accordingly, it is an object of the present invention to provide a design for a semiconductor memory device which can reduce an area occupied by a chip by serially forming transistors to which difference power voltages are applied within a single well.

It is another object of the invention to provide a semiconductor memory device which minimizes a layout area by serially forming a plurality of inverter circuits using at least two different power voltages.

In accordance with one aspect of the invention, there is provided a semiconductor memory device operable under a first power voltage and a second power voltage which are different from each other. The memory device includes a substrate of a first conductivity type, a well of a second conductivity type defined in said substrate, and first and second inverter circuits defined serially with one another on the substrate and common well. The first inverter circuit includes a first transistor of a second conductivity type on the substrate and a first transistor of a first conductivity type on the well for receiving a first power voltage and generating a first inverted output voltage in response to a first input voltage applied to gates of the respective first transistors. The second inverter circuit includes a second transistor of a second conductivity type on the substrate and a second transistor of a first conductivity type on the well for receiving a second power voltage and generating a second inverted output voltage in response to a second input voltage applied to gates of the respective second transistors.

Various other advantages and features of the present invention become better understood with reference to the following description. In the drawings, like reference symbols designate like elements.

DETAILED DESCRIPTION OF THE PREFERRED EMBODIMENT

Figure 1:
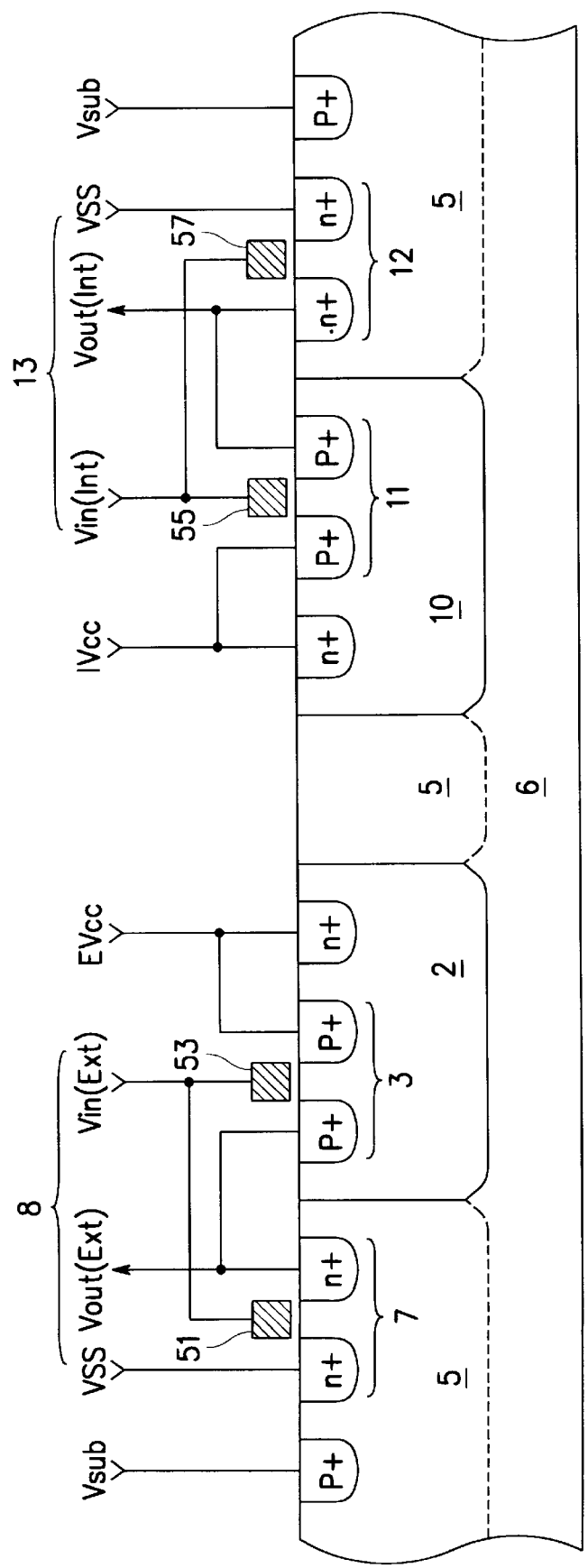
FIG. 1 is a vertical cross-sectional view showing separated inverter circuits of a semiconductor memory device according to the prior art.
Figure 2:
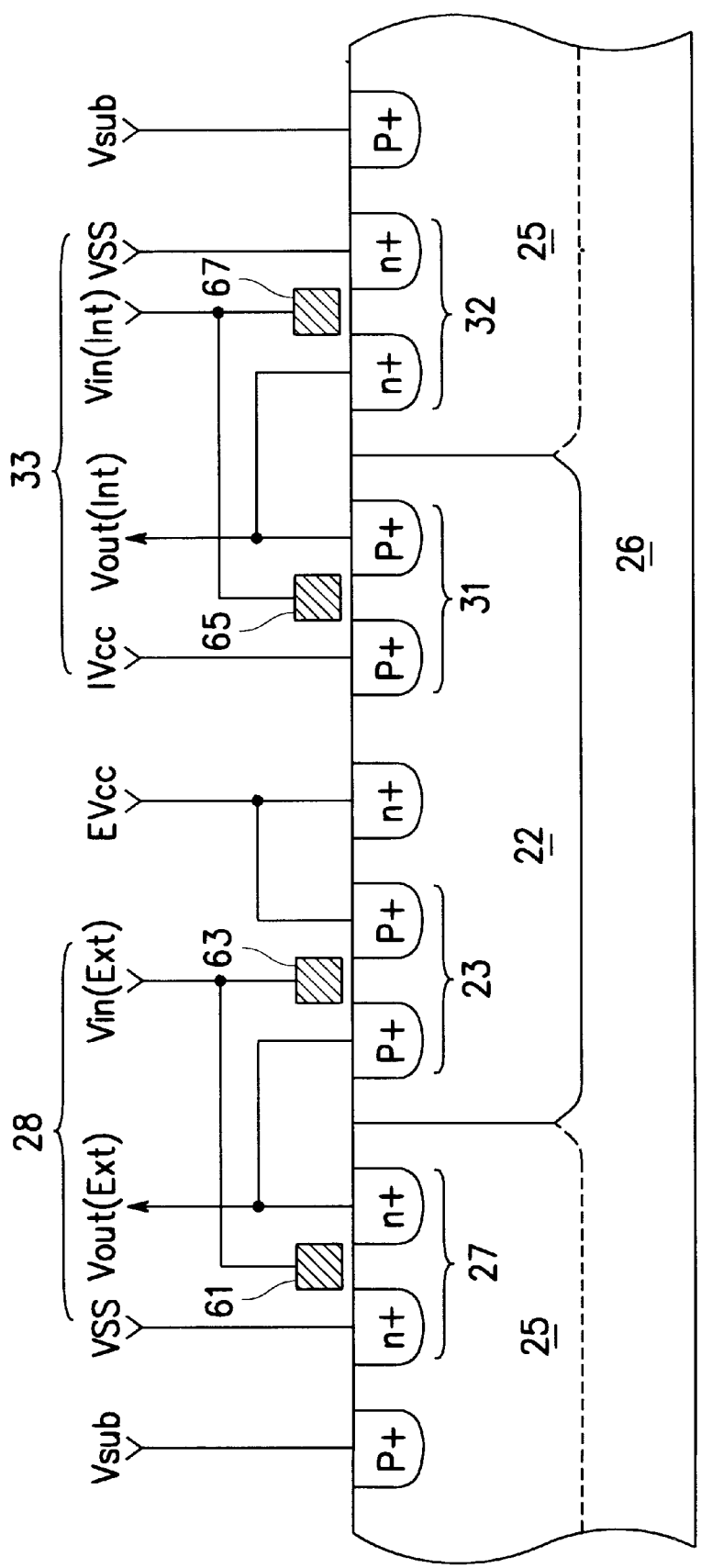
FIG. 2 is a vertical cross-sectional view showing serially connected inverter circuits of a semiconductor memory device constructed according to the present invention.

Referring to FIG. 2, a first inverter 28 includes a first P-channel transistor 23 formed within an N-well 22 or a common well to which an external power voltage EVCC (i.e., a first power voltage) is applied, and a first N-channel transistor 27 formed within a P-well 25 or a P-type substrate 26 (hereinafter "substrate") to which a substrate voltage Vsub is applied. A second inverter 33 includes a second P-channel transistor 31 formed within the N-well 22, and a second N-channel transistor 32 formed within the substrate to which the substrate voltage Vsub is applied.

An internal power voltage IVCC (i.e., a second power voltage), lower than the external power voltage EVCC, is applied to the source of the second P-channel transistor 31. The substrate voltage Vsub is a ground voltage VSS or a negative voltage applied to the substrate.

An input voltage Vin(Ext) is supplied to gates 61 and 63 of the first N-channel transistor 27 and the first P-channel transistor 23, respectively. The first P-channel transistor 23 and the first N-channel transistor 27, when activated by the application of the input voltage Vin(Ext) to their gates, generate an output voltage Vout(Ext) through their common drains.

Similarly, an input voltage Vin(Int) is supplied to gates 65 and 67 of the second P-channel transistor 31 and the second N-channel transistor 32, respectively. The second P-channel transistor 31 and the second N-channel transistor 32, when activated by the application of the input voltage Vin(Int) to their gates, generate an output voltage Vout(Int) through their common drains.

In this case, the first power voltage EVCC is preferably equal to or greater than the input voltage Vin(Ext), and the second power voltage IVCC is preferably equal to or greater than the input voltage Vin(Int). The external power voltage EVCC of the first power voltage, which is a relatively high voltage among power voltages used in a semiconductor memory device, is applied to the source of the first P-channel transistor 23. The internal power voltage IVCC of the second power voltage, which is a relatively low voltage, is applied to the source of the second P-channel transistor 31. Therefore, the problem of forward bias in the PN junction of the second P-channel transistor 31, to which the internal power voltage IVCC by the high external power voltage EVCC is applied, is eliminated.

As noted above, at least two inverters using the different power voltages are connected by forming the transistors having the same conductivity type within the same well. Therefore, a space between the wells, which is required in prior devices in order to prevent the mutual interference generated by the difference power voltages, can be eliminated. Consequently, the circuit area required for the dual power memory circuit can be reduced.

It should be understood that the present invention is not limited to the particular embodiment disclosed herein as the best mode contemplated for carrying out the present invention, but rather that the present invention is not limited to the specific embodiments described in this specification except as defined in the appended claims.

What is claimed is:

1. A semiconductor memory device operable under a first power voltage and a second power voltage which are different from each other, comprising:
   a substrate of a first conductivity type;
   a well of a second conductivity type defined in said substrate to which a first power voltage is applied;
   a first inverter circuit having a first transistor of a second conductivity type on the substrate and a first transistor of a first conductivity type on the well, said first inverter circuit receiving the first power voltage and generating a first inverted output voltage in response to a first input voltage applied to gates of said respective first transistors; and
   a second inverter circuit having a second transistor of a second conductivity type on the substrate and a second transistor of a first conductivity type defined commonly on the well with said first transistor of said first conductivity type, said second inverter circuit receiving a second power voltage and generating a second inverted output voltage in response to a second input voltage applied to gates of said respective second transistors.

2. A semiconductor memory device as claimed in claim 1, wherein said first and second power voltages are respectively applied to respective sources of said first and second transistors of a first conductivity type.

3. A semiconductor memory device as claimed in claim 1, wherein said first power voltage is higher than said second power voltage.

4. A semiconductor memory device as claimed in claim 1, further including a substrate voltage formed of a ground voltage or of a negative voltage applied to said substrate.

5. A semiconductor memory device as claimed in claim 4, further including first and second wells doped with P-type impurities to which said substrate voltage is applied.

6. A semiconductor memory device as claimed in claim 4, further including first and second wells doped with N-type impurities to which said substrate voltage is applied.

7. A semiconductor memory device as claimed in claim 1, wherein said first and second transistors of a first conductivity type include a P-type channel.

8. A semiconductor memory device as claimed in claim 1, wherein said first and second transistors of a second conductivity type include an N-type channel.

9. A semiconductor memory device as claimed in claim 1, wherein said first power voltage is an external power voltage.

10. A semiconductor memory device as claimed in claim 1, wherein said second power voltage is an internal power voltage generated from an internal power voltage generating circuit which drops said first power voltage to a constant voltage.

11. A semiconductor memory device as claimed in claim 1, wherein a plurality of said first and second inverter circuits are serially connected.

12. A semiconductor memory device as claimed in claim 1, wherein said first input voltage is higher than said second input voltage.

13. A method for applying a plurality of power voltages to a semiconductor memory device comprising the steps of:
   forming a substrate of a first conductivity type;
   forming first and second transistors of a second conductivity type on the substrate;
   forming third and fourth transistors of the first conductivity type commonly on a well of the second conductivity type;
   operating a source of said first and second transistors under a ground voltage;
   operating the substrate under a substrate voltage;
   applying a first power voltage to a source of the third transistor and to the common well;
   applying a second power voltage, less than said first power voltage, to a source of the fourth transistor so as to substantially eliminate forward bias between the third and fourth transistors;
   applying an external voltage to a gate of the first and third transistors to activate said first and third transistors and commonly output a first output voltage from drains of said first and third transistors; and applying an internal voltage to a gate of the second and fourth transistors to activate said second and fourth transistors and commonly output a second output voltage from drains of said second and fourth transistors.

14. The method of claim 13, wherein the first power voltage supplied to the source of the third transistor is higher than the second power voltage supplied to the source of the fourth transistor.

15. A semiconductor memory device operable under a plurality of power voltages, comprising:

a P-type substrate;

an N-well defined in said P-type substrate to which an external power bias voltage is applied;

a first inverter circuit having a first N-channel transistor on the P-type substrate and a first P-channel transistor on the N-well, said external power bias voltage being applied to a source of said first P-channel transistor; and a second inverter circuit having a second N-channel transistor on the P-type substrate and a second P-channel transistor defined commonly on the N-well with said first P-channel transistor, a source of said second P-channel transistor being coupled to an internal power bias voltage less than the external power bias voltage.

* * * * *